(12) United States Patent
Chai et al.

(10) Patent No.: US 7,073,112 B2
(45) Date of Patent: *Jul. 4, 2006

(54) COMPILABLE ADDRESS MAGNITUDE COMPARATOR FOR MEMORY ARRAY SELF-TESTING

(75) Inventors: Chiaming Chai, Durham, NC (US); Jeffrey H. Fischer, Cary, NC (US); Michael R. Ouellette, Westford, VT (US); Michael H. Wood, Hopewell Jct, NY (US)

(73) Assignee: International Business Machines Corporation, Armonk, NY (US)

( * ) Notice: Subject to any disclaimer, the term of this patent is extended or adjusted under 35 U.S.C. 154(b) by 5 days.

This patent is subject to a terminal disclaimer.

(21) Appl. No.: 10/681,856

(22) Filed: Oct. 8, 2003

(65) Prior Publication Data

US 2004/0071009 A1 Apr. 15, 2004

Related U.S. Application Data

(62) Division of application No. 09/669,117, filed on Sep. 25, 2000, now Pat. No. 6,658,610.

(51) Int. Cl.
*G01R 31/28* (2006.01)
(52) U.S. Cl. ...................... 714/733; 714/718
(58) Field of Classification Search ............ 714/733, 714/718, 732, 722, 710, 736, 738, 746, 719, 714/763; 365/201, 200, 49
See application file for complete search history.

(56) References Cited

U.S. PATENT DOCUMENTS

| 4,939,694 | A | * | 7/1990 | Eaton et al. ............... 365/200 |
| 5,388,104 | A | | 2/1995 | Shirotori et al. |
| 5,416,920 | A | | 5/1995 | Saito et al. |
| 5,535,164 | A | * | 7/1996 | Adams et al. ............. 365/201 |
| 5,646,948 | A | | 7/1997 | Kobayashi et al. |
| 5,673,388 | A | | 9/1997 | Murthi et al. |
| 5,675,545 | A | | 10/1997 | Madhavan et al. |
| 5,689,466 | A | | 11/1997 | Qureshi |
| 5,719,879 | A | | 2/1998 | Gillis et al. |
| 5,740,098 | A | * | 4/1998 | Adams et al. ............. 365/49 |
| 5,740,179 | A | | 4/1998 | Dorney et al. |
| 5,796,745 | A | | 8/1998 | Adams et al. |
| 5,818,772 | A | | 10/1998 | Kuge |
| 5,835,502 | A | | 11/1998 | Aipperspach et al. |
| 5,961,653 | A | | 10/1999 | Kalter et al. |
| 5,961,657 | A | | 10/1999 | Park et al. |
| 5,963,566 | A | | 10/1999 | Rajsuman et al. |

(Continued)

*Primary Examiner*—Guy Lamarre
*Assistant Examiner*—Mujtaba K. Chaudry
(74) *Attorney, Agent, or Firm*—Schmeiser, Olsen & Watts; Anthony Canale

(57) ABSTRACT

An apparatus that improves Built-In-Self-Test (BIST) flexibility. A compilable address magnitude comparator facilitates BIST testing of different size memory arrays without requiring customization of the BIST controller. The compilable address magnitude comparator is compiled within the compilable memory arrays of the ASIC to allow a single BIST controller to test multiple sizes of memory arrays without requiring that the BIST controller be compilable. The compilable magnitude address comparator overrides the self-test signal from the BIST when the BIST attempts to test addresses not existing in the memory. The BIST is prevented from writing to addresses that do not exist, and does not receive error signals from those addresses. The BIST controller is able to test memory arrays without regard for their particular size. A single BIST controller can be used to test multiple memory arrays of different sizes in the ASIC, reducing device complexity.

6 Claims, 9 Drawing Sheets

U.S. PATENT DOCUMENTS

| | | |
|---|---|---|
| 5,974,579 A | 10/1999 | Lepejian et al. |
| 6,081,910 A * | 6/2000 | Mifsud et al. .............. 714/718 |
| 6,108,252 A | 8/2000 | Park |
| 6,249,889 B1 | 6/2001 | Rajsuman et al. |
| 6,343,366 B1 | 1/2002 | Okitaka |
| 6,351,789 B1 | 2/2002 | Green |
| 6,360,342 B1 * | 3/2002 | Lee et al. ................... 714/718 |
| 6,658,610 B1 * | 12/2003 | Chai et al. .................. 714/718 |
| 6,728,910 B1 * | 4/2004 | Huang ........................ 714/711 |

* cited by examiner

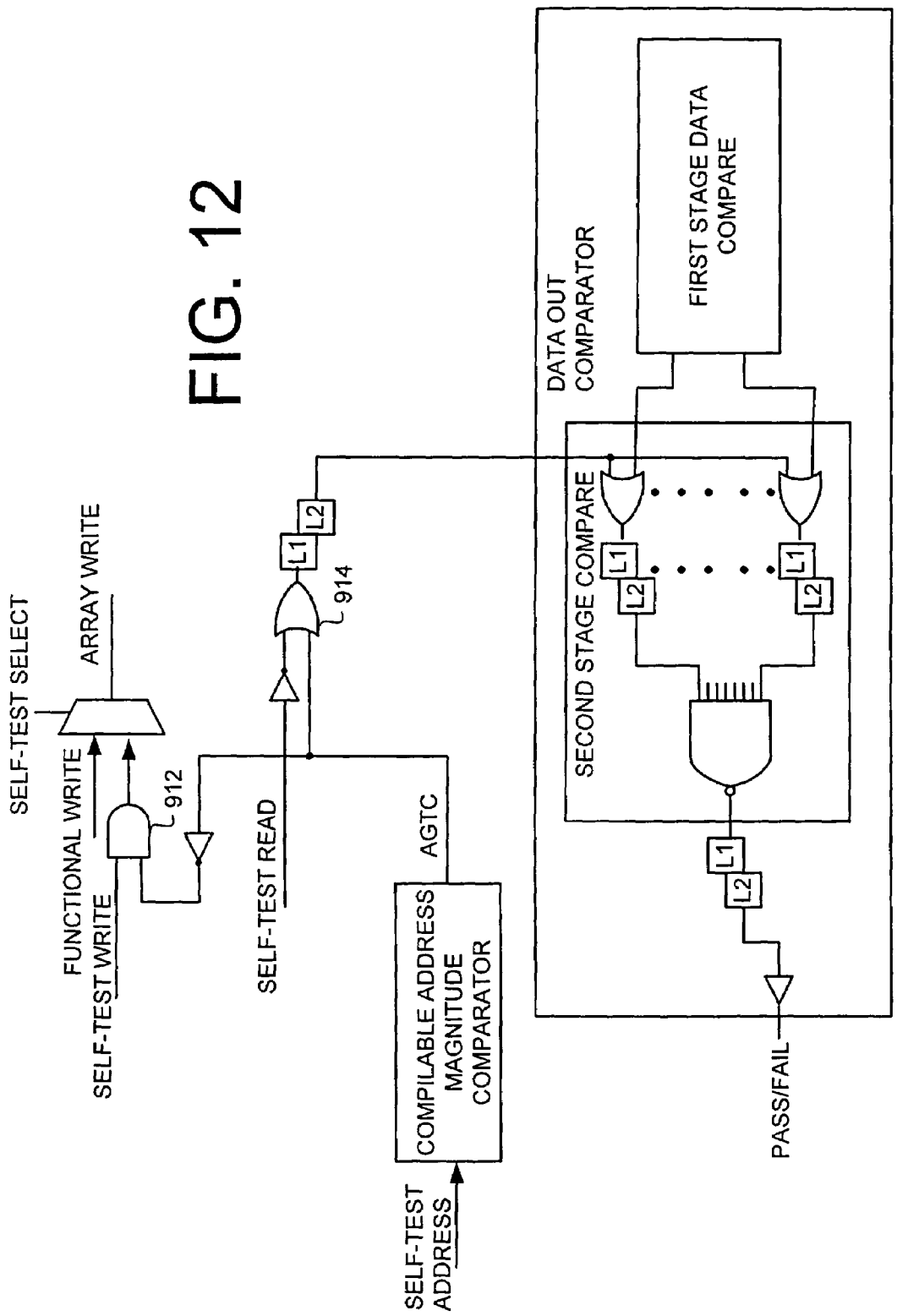

COMPILABLE ADDRESS MAGNITUDE COMPARATOR FOR MEMORY ARRAY SELF-TESTING

This application is a divisional of Ser. No. 09/669,117; filed on Sep. 25, 2000, now U.S. Pat. No. 6,658,610.

BACKGROUND OF THE INVENTION

1. Technical Field

This invention generally relates to semiconductor devices, and more specifically relates to self-test devices for memory arrays.

2. Background Art

The proliferation of modem electronics is due in large part to the development of the integrated circuit. An application specific integrated circuit (ASIC) is a collection of logic and memory circuits designed to perform a specific task to meet the needs of a customer application. ASIC designs are implemented on a silicon die by mapping logic functions to a set of pre-designed, pre-verified logic circuits. These circuits range from the simplest functions to highly complex circuits referred to as "cores." Cores are typically high level industry-standard functions, such as a digital signal processor (DSP), an advanced RISC machines (ARM) microprocessor, an Ethernet function, or a peripheral component interconnect (PCI) controller. With a particular design in mind, customers can quickly assemble an ASIC design by using cores as building blocks.

One of the more commonly used cores are those that provide memory arrays for use in ASIC. Typically, memory cores are designed to be compilable, i.e., the parameters of the memory array can be customized to meet the requirements of a particular design. Typically, a compilable memory core allows the design to specify parameters such as the number or words and the width of the words. Additionally, compilable memory array cores typically allow designers to specify decode options and other parameters. Thus, one ASIC memory array core can provide memory structures for a wide variety of applications.

Modern memory arrays commonly include self-test circuitry designed to facilitate testing of the memory array after fabrication. These devices, typically referred to as "built-in-self-test" (BIST) controllers, provide the memory core with the ability to perform self tests to determine which cells in the memory are functioning properly. Typically, these BIST controllers provide the ability to perform a test pattern routing that involves writing to each memory cell in the array, and then reading from the cells to determine which cells are operating properly. In particular, the BIST controller writes a defined pattern into the memory, and reads the data back from the array. The read data is then compared to the "expect data" by the memory array, and the RAM sends back a pass/fail signal. The BIST then logs the pass fail, and uses that information to determine whether the memories embedded within the ASIC are functional.

The use of traditional BIST controllers in ASIC design has significant limitations. First, it has been traditionally difficult to adapt BIST controllers to compilable memory arrays. In particular, it has been difficult to design "compilable" BIST controllers that were able to efficiently test memory arrays that could be compiled to different sizes. Typically, BIST controller designs that were "compilable" to work with different sizes of memory arrays have been excessively difficult, and introduced significant complexity to the design and fabrication of the ASIC.

Another difficulty faced in prior art solutions is the inability of prior art BIST controllers to test multiple memory arrays on an ASIC where the memory arrays are of different sizes. For example, if an ASIC design required two different memory arrays, each having a different number of words or different decode options, the ASIC would typically require two different BIST controllers. This was a direct result of the specialization needed by BIST controllers to accurately test memory arrays of a particular size. For example, a BIST controller compiled to test a memory array having 1 k words (i.e., a 1 k×16 array) could not test an array having 2 k words, (i.e., a 2 k×16 array). Additionally, a BIST controller compiled to test a memory array with a 4:1 decode option would not be able to test a memory array compiled with an 8:1 decode option.

The reason for this limitation is that test errors would occur when the BIST controller attempts to test addresses outside of the actual dimensions of the memory array. In particular, if the BIST controller attempts to write to a memory address that does not exist, it would likely instead write to another, unknown location in the array, and thus corrupting the data in the memory array. In addition, when the BIST controller attempts to read from a memory address that does not exist, it is likely that it would instead read a random address in the array, making it again impossible to do a valid compare.

To overcome this, prior art solutions have required multiple BIST controllers, with a different BIST controller for each size memory array in the ASIC. Again, this solution is not desirable because of the excessive chip area used in the ASIC by having multiple BIST controllers.

Thus, what is needed is a method and apparatus that provides for increased BIST flexibility without the complexity of a compilable BIST circuit. Additionally, what is needed is the ability to use a single BIST to test multiple memory arrays of different sizes.

DISCLOSURE OF INVENTION

The present invention provides a method and apparatus that improves Built-In-Self-Test (BIST) flexibility without requiring the complexity of a compilable BIST circuit. Additionally, the present invention provides the ability to use a single BIST to test multiple memory arrays of different sizes. The preferred embodiment of the present invention provides a compilable address magnitude comparator to facilitate BIST testing of different size memory arrays without requiring customization of the BIST controller. The preferred embodiment compilable address magnitude comparator is compiled within the compilable memory arrays of the ASIC to allow a single BIST controller to test multiple sizes of memory arrays without requiring that the BIST controller itself be compilable. In the preferred embodiment, the compilable magnitude address comparator overrides the self-test signal from the BIST when the BIST attempts to test addresses that do not exist in the memory. As such, the BIST is prevented from writing to addresses that do not exist, and does not receive error signals from those addresses. Thus, the BIST controller is able to test memory arrays without regard for their particular size. Furthermore, a single BIST controller can then be used to test multiple memory arrays of different sizes in the ASIC, again reducing device complexity.

In the most preferred embodiment, the compilable address magnitude comparator is made part of the compilable memory arrays. Thus, when a memory array is added to an ASIC, the address magnitude comparator is included as part of the memory array to interface with the BIST controller.

The foregoing and other objects, features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and:

FIGS. 11–12 are circuit diagrams illustrating methods for using the preferred compilable address magnitude comparator in combination with different types of memory arrays and BIST controllers.

BEST MODE FOR CARRYING OUT THE INVENTION

The present invention provides a method and apparatus that improves Built-In-Self-Test (BIST) flexibility without requiring the complexity of a compilable BIST controller circuit. Additionally, the present invention provides the ability to use a single BIST controller to test multiple memory arrays of different sizes. The preferred embodiment of the present invention provides a compilable address magnitude comparator to facilitate BIST testing of different size memory arrays without requiring customization of the BIST controller. The preferred embodiment compilable address magnitude comparator is compiled within the compilable memory arrays of the ASIC to allow a single BIST controller to test multiple sizes of memory arrays without requiring that the BIST controller itself be compilable. In the preferred embodiment, the compilable magnitude address comparator overrides the self-test signal from the BIST when the BIST attempts to test addresses that do not exist in the memory. As such, the BIST is prevented from writing to addresses that do not exist, and does not receive error signals from those addresses. Thus, the BIST controller is able to test memory arrays without regard for their particular size. Furthermore, a single BIST controller can then be used to test multiple memory arrays of different sizes in the ASIC, again reducing device complexity.

In the most preferred embodiment, the compilable address magnitude comparator is made part of the compilable memory arrays. Thus, when a memory array is added to an ASIC, the address magnitude comparator is added as part of each memory array to interface with the BIST controller. In particular, during design of the ASIC a compilable address magnitude comparator is added with each compilable memory, with each compilable address magnitude comparator testing for a compiled maximum address that corresponds to the maximum valid addresses for its corresponding memory array. Thus designed and implemented, each compilable address magnitude comparator "knows" the maximum addresses of its corresponding memory array and can thus be used to override testing when the BIST attempts to test an out-of-range address.

Memory array designs typically use a two-dimensional address space, designed as rows and columns. Accordingly, the address field is divided into a "row address" and a "column address", with the decode option specifying the number of columns. In particular, during the compile process, three basic parameters go into the compiler to determine the memory array structure, the number of words, the width of the word, and the decode options. These same parameters can then also be used to determine the compiled maximum address used by the corresponding compilable address magnitude comparator.

Figure 1:
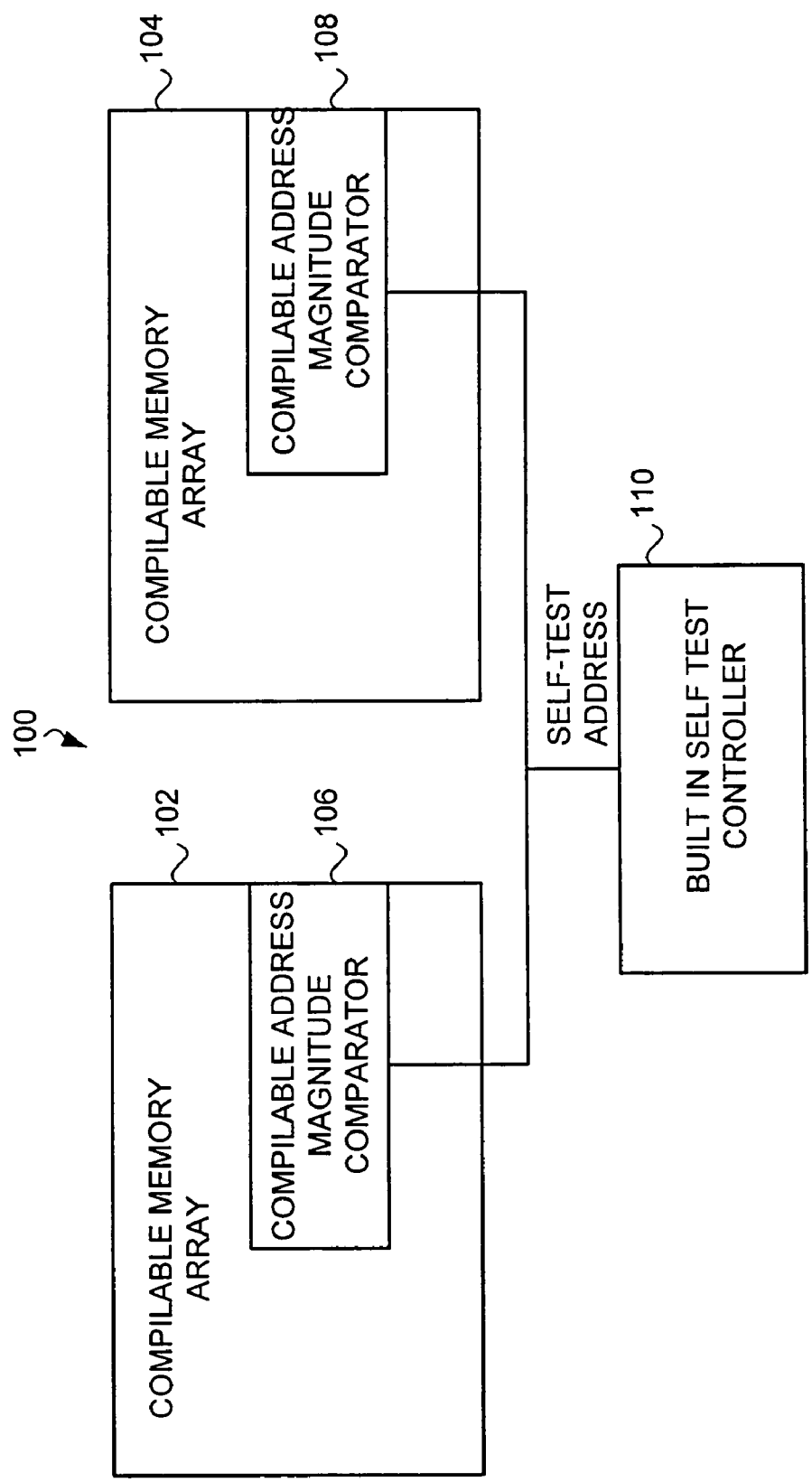
FIG. 1 is a schematic view of a simplified portion of an application specific integrated circuit (ASIC) in accordance with the preferred embodiment.

Turning now to FIG. 1, a simplified portion of an application specific integrated circuit (ASIC) is show in accordance with the preferred embodiment of the present invention. Specifically, FIG. 1 illustrates an ASIC portion 100 that includes two compilable memory arrays, a BIST controller, and a two compilable address magnitude comparators. Not illustrated in FIG. 1 are the many connection details, or many of the other devices that would be commonly found on a typical ASIC. In accordance with the preferred embodiment, a compilable address magnitude comparator is included with each memory array. During testing, the BIST controller tests each memory cell in each array as follows. First, the BIST controller writes a portion of the array. The BIST controller then tells the memory array to read back the pattern, and tells the memory array what it expects to be stored at that portion. The memory array compares the read values to the expected values, and sends back a pass/fail signal, with the BIST controller logging any fails. By testing the entire memory array in this manner, the BIST controller is able to determine whether the memory arrays are functioning properly.

In the preferred embodiment of the present invention, each compilable address magnitude comparator will intercept address signals for its corresponding memory array during self test, and compare those address signals to the compiled maximum addresses for its corresponding memory array. If the intercepted address is less than or equal to the compiled maximum address, the self-test operation initiated by the BIST controller is allowed to continue. If the intercepted address is greater than the compiled maximum address, then the compilable address magnitude comparator overrides the self-test operation. In particular, during a self-test write operation the address magnitude comparator prevents a test pattern from being written to the out-of-range address. Additionally, during a self-test read operation, the compiled address magnitude comparator prevents a "fail" signal from being provided back to the BIST for out-of-range addresses.

Because the compilable address magnitude comparators handle situations in which the BIST controller attempts to test out-of-range addresses, it is not required to customize the BIST controller itself for the particular size of the memory arrays. This feature further allows the BIST controller to be used to test memory arrays of different sizes. Specifically, all that is needed is a BIST controller that is designed to test the largest compilable memory array option.

For example, in the illustrated embodiments, compilable memory array 102 can comprise a 2048 words/4:1 decode option memory array, and compilable memory array 104 can comprise a 1024 words/8:1 decode option. In this example, the compilable address magnitude comparators would be compiled during design such that the compiled maximum address for comparator 106 is 512 in the row dimension, and 4 in the column dimension, and the compiled maximum address for comparator 108 is 128 in the row dimension and 8 in the column dimension. As such, the only BIST controller requirement would be that it be large enough to test both memory arrays fully. As such, it would need to be able to test 512 rows and 8 columns.

Then, during testing, when BIST controller 110 attempts to test out-of-range addresses (in either the row or column dimension), the corresponding comparator will prevent the attempted test, i.e., it will prevent data from being written into the array during the test and prevent a fail signal from being generated by the self-test data out comparator. Thus, BIST controller 110 can be used to test both memory arrays without any specific knowledge about their individual dimensions.

Figure 2:
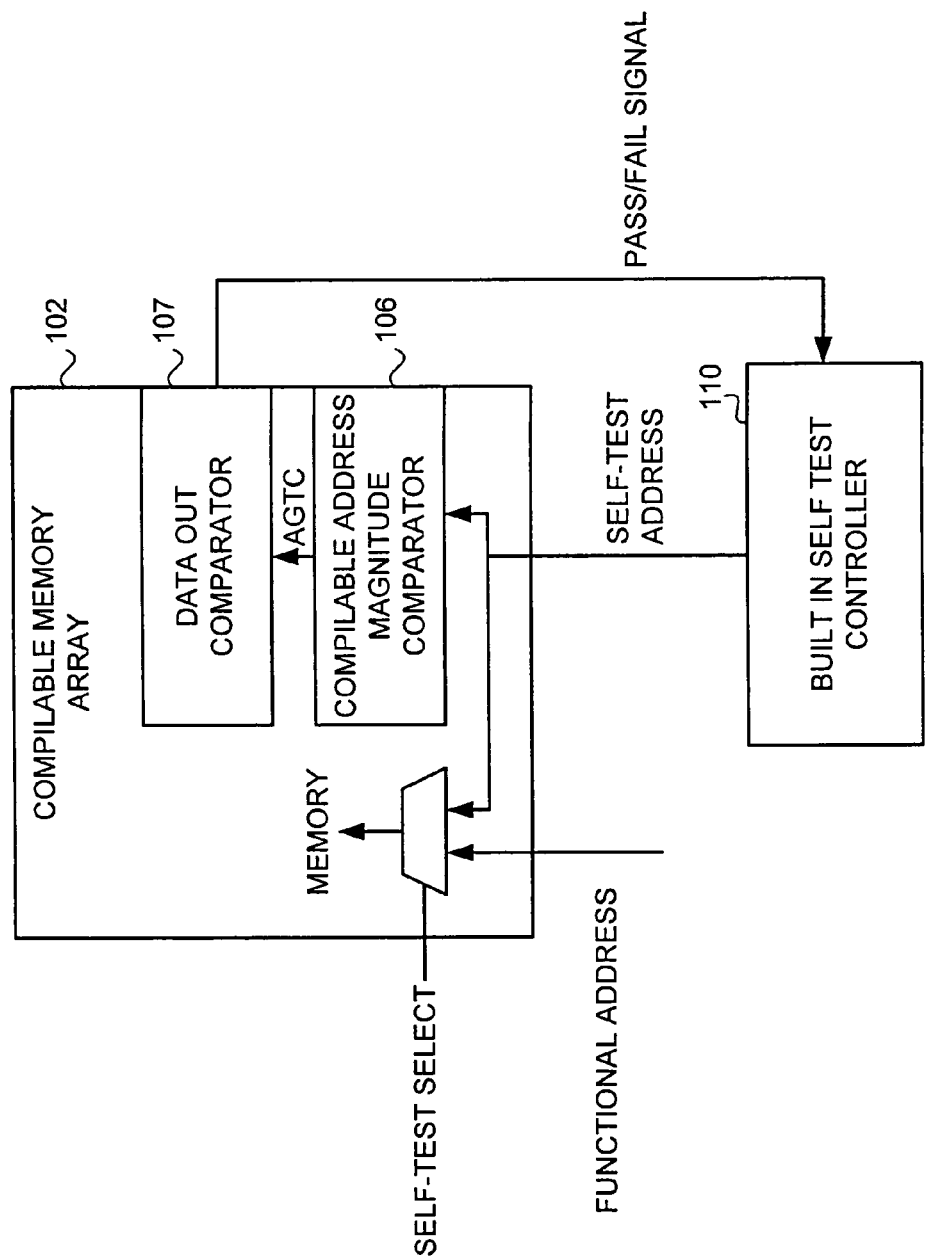
FIG. 2 is a schematic view of a compilable address magnitude comparator and a BIST controller.

Turning now to FIG. 2, a compilable address magnitude comparator and a BIST controller are illustrated in more detail to better show the interactions between devices. In particular, FIG. 2 illustrates how BIST controller 110 provides a self-test address signal to the memory array. During normal operation, the functional address is used to store and retrieve data to and from the memory array. During self-testing, the functional address is replaced with the "self-test" address provided by the BIST controller. The BIST controller thus writes to each address in the memory array. The self-test data is then read from the memory array, and compared to an expected value by the data out comparator 107. The data out comparator 107 then outputs a pass/fail signal back to the BIST controller for each memory address. Thus, the BIST controller is able to test each address in the memory array.

In the preferred embodiment of the present invention, the self-test address is provided to both the compilable address magnitude comparator 106 and the memory array itself. Thus, the compilable address magnitude comparator 106 can test incoming self-test addresses to determine if they are out-of-range. Again, if the compilable address magnitude comparator 106 determines a self-test address is in-range, the self-test operation is allowed to proceed. If the compilable address magnitude comparator 106 determines the address is out-of-range, the self-test operation is modified. In particular, if the address is out of range, the AGTC (address A Greater Than address C) signal is provided to the data out comparator 107. This prevents the self-test data out compare and thus prevents a false fail from being sent to the BIST controller. The AGTC signal is also used in the memory array to block self-test write operations for out-of-range addresses.

Figure 3:
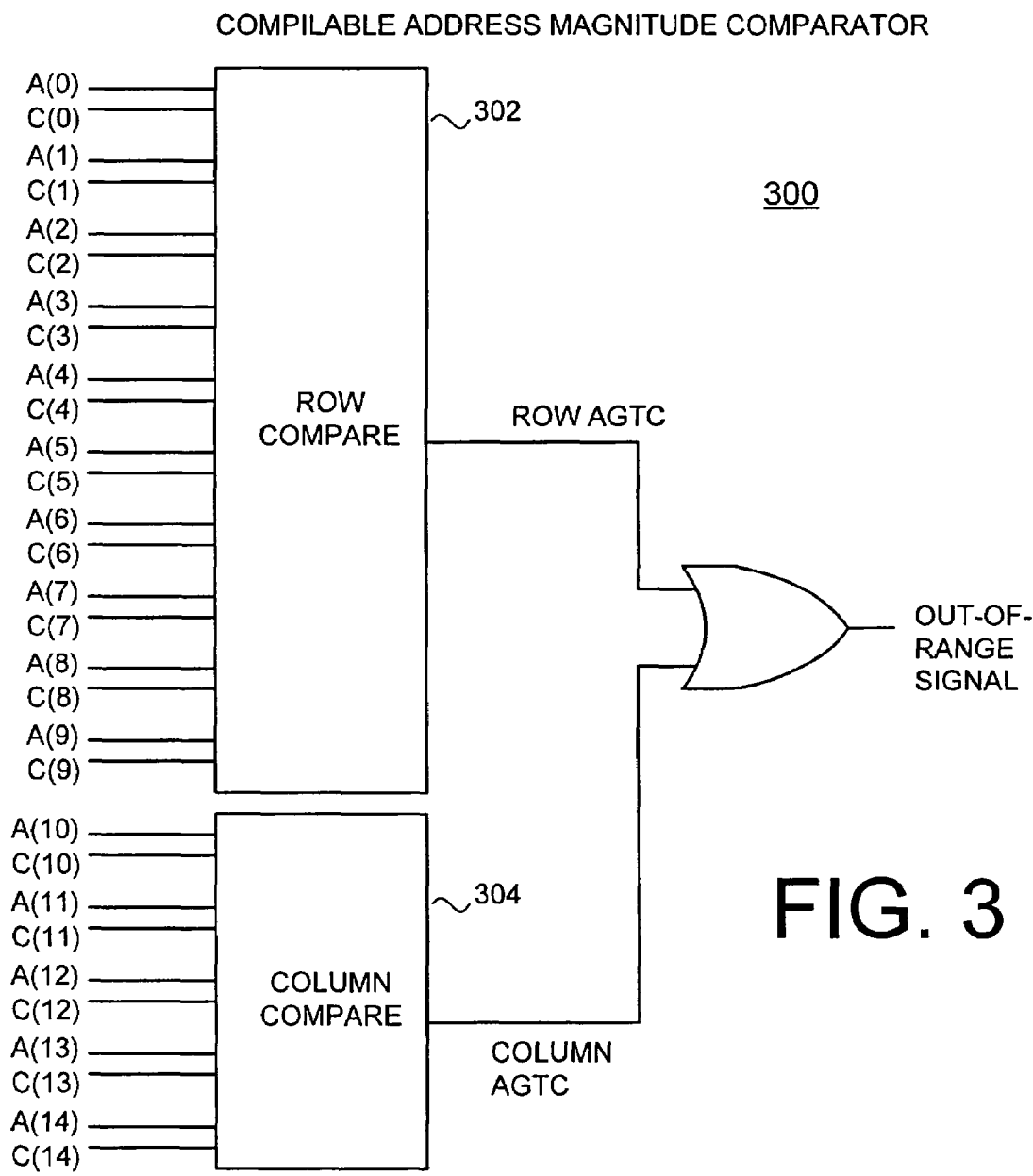
FIG. 3 is a schematic view of an exemplary compilable address magnitude comparator.

Turning now to FIG. 3, an exemplary compilable address magnitude comparator 300 is illustrated in more detail. The illustrated compilable address magnitude comparator 300 will be used to explain the operation of the comparator. However, as will be explained in greater detail later, in most cases the implementation of the comparator 300 will be simplified depending upon the desired application. The compilable address magnitude comparator 300 includes a row compare 302 that compares incoming self-test row addresses, and a column compare 304 that compares incoming self-test column addresses, and generates an out-of-range signal when either address exceeds a compiled maximum address.

The compilable address magnitude comparator 300 includes a plurality of self-test address inputs A(0)–A(14) and a plurality of compiled maximum addresses C(0)–C(14). In the illustrated example, inputs 0–9 correspond to row addresses, and inputs 10–14 correspond to column addresses. Thus, the illustrated compilable address magnitude comparator 300 can be used for memory arrays having up to 1024 rows and 32 columns. Of course, the compilable address magnitude comparator 300 can easily be implemented with more, or less capability depending upon the particular needs of an application.

In operation, row compare 302 compares the incoming self-test row address on A(0)–A(9) during self-testing with the compiled maximum row address on C(0)–C(9). Likewise, column compare 304 compares the incoming self-test column addresses on A(10)–A(14) with the compiled maximum column address on C(10)–C(14). If the incoming row address is greater than the compiled maximum row address, than a ROW AGTC signal is generated. Likewise, if the incoming column address is greater than the compiled maximum column address, then a COLUMN AGTC signal is generated. If either signal is generated, then the incoming address is out of range and an out-of-range signal is generated.

As previously stated, the maximum address values are set during design of the ASIC such that they correspond to the maximum address values of the corresponding memory array. Thus, when generating the compiled memory array, the compiler sets the values for inputs C(0)–C(14) to either high or low depending on the size of the corresponding memory array.

For example, assume a corresponding memory array having 512 rows and 4 columns. The maximum valid row address would then be 511, and the maximum valid column address would be 3. Because 511 converts to binary 0111111111, the compiler would tie input C(9) to zero, and inputs C(8)–C(0) would be tied to one. Likewise, because three columns converts to binary 00011, the compiler would tie inputs C(14)–C(12) to zero and inputs C(11) and C(10) to one. So compiled and implemented, any row address above 511 would generate a ROW AGTC signal, and any column address above 3 would generate a COLUMN AGTC signal, and either of those signals will trigger an out-of-range signal.

Row compare 302 and column compare 304 can be implemented using any suitable compare device. Furthermore, as will be explained later, the implementation of row compare 302 and column compare 304 can be modified to better fit specialized applications, and can themselves be compilable for maximum flexibility.

Figure 4:
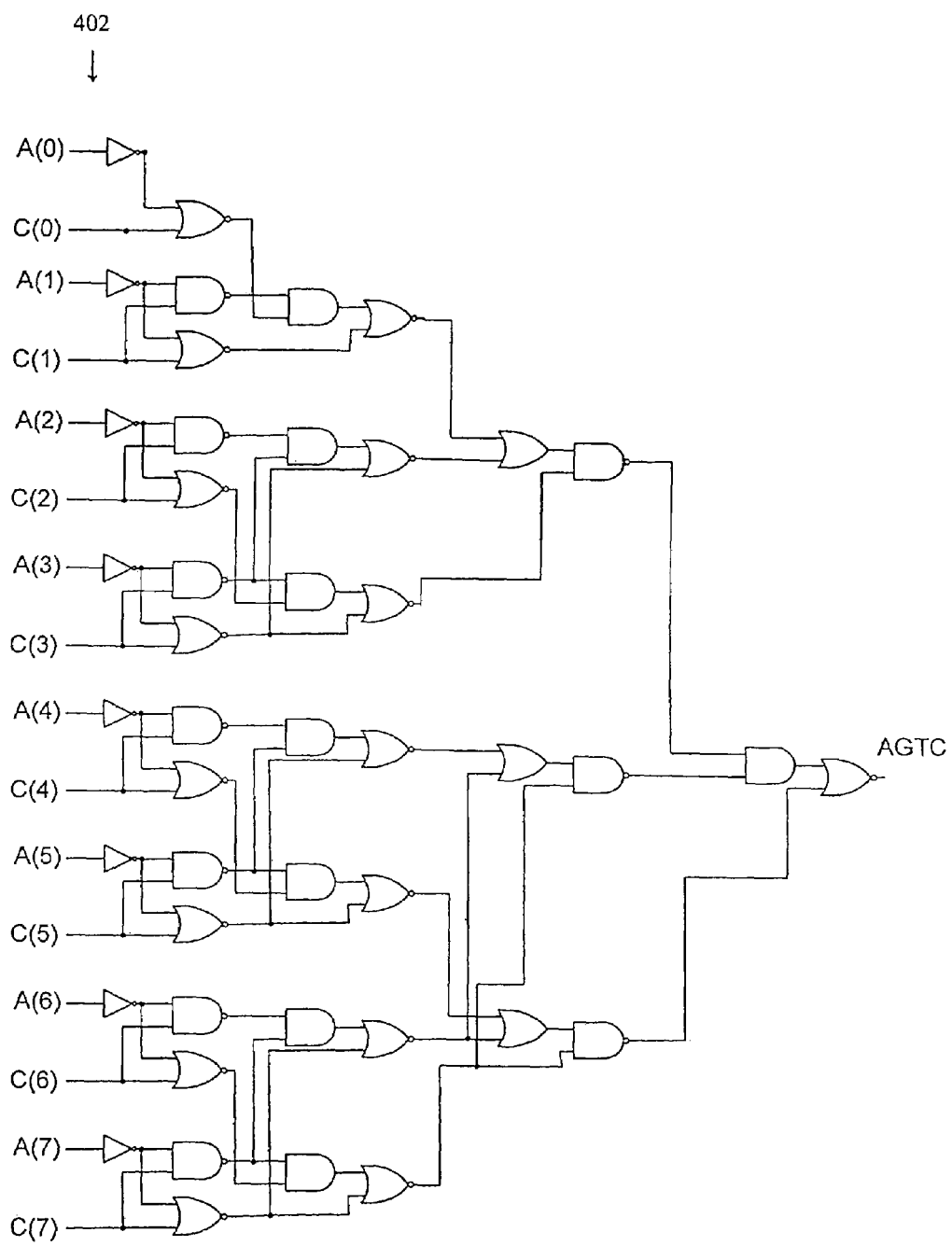
FIG. 4 is a schematic view of an exemplary compilable address magnitude comparator.

Turning now to FIG. 4, an exemplary compare device 402 is illustrated. As will be understood by those skilled in the art, the compare device 402 as illustrated serves to compare inputs A(0)–A(7) with the corresponding inputs C(0)–C(7). Furthermore, those skilled in the art will further understand that compare device 402 can be expanded to add additional inputs, or reduced to have less inputs. As such, compare circuits similar to compare device 402 can be used for both row compare the 302 and the column compare 304 illustrated in FIG. 3. Of course, this is just one example of the many types of compare circuits that can be used to implement the preferred embodiments of the present invention.

As an example of how a compare circuit can be modified for a particular application, some compilable memory arrays are limited to row compilations in fixed minimum granularities. For example, a given compilable memory array may be limited to adding 16 rows per compile increment. With an array compiled at a minimum granularity of 16 rows, the 4 least significant bits of the row address are irrelevant for out-of-range address detection, since any combination of these 4 address bits will exist in both in-range and out-of-range row address values. Returning to FIG. 4, for such a compilable memory array, the 4 least significant address bits can be ignored. Thus, address bits A(0)–A(3) can be ignored, and the compare device 402 is simplified to receive and compare four less inputs.

Figure 5:
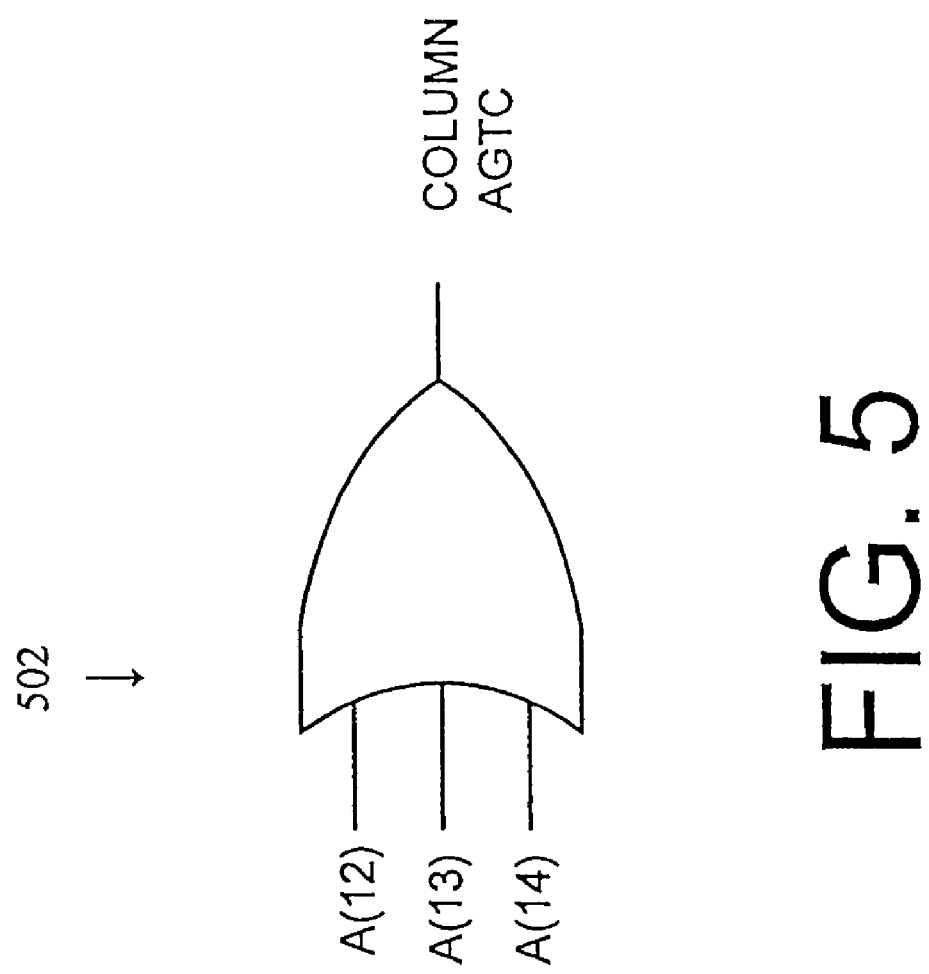
FIG. 5 is a schematic view of an exemplary column compare.

Turning now to FIG. 5, an exemplary column compare 502 is illustrated that can be used for particular applications. In particular, column compare 502 can be used where the corresponding compilable memory array is limited to 4:1 decode. In a 4:1 decode, there are 4 columns. In a 4:1 decode, address bits A(10) and A(11) are fully used (i.e., all combinations are valid) and thus do not need to be checked. Furthermore, any high value on address signals, A(12)–A(14) will indicate an out-of-range column address. Thus, a column compare can be implemented for a 4:1 decode memory array by simply inputting the unused address bits into an OR gate.

Of course, this implementation can be easily modified to work with other decode options. Specifically, this implementation can be easily modified to work with compilable memory arrays that are limited to power-of-two decodes. In memory arrays limited to power-of-two decodes, the number of columns is limited to power-of-two numbers, i.e., 2, 4, 8, 16, 32, etc. Thus, a compilable column compare can be provided by simply providing for a changing number of inputs to the OR gate, and adding out-of-range column address signals as inputs to the OR gate. For example, the compiler can implement a column compare for an 8:1 decode by utilizing a 2-input OR gate with the inputs connected to self-test addresses A(13)–A(14).

Figure 6:
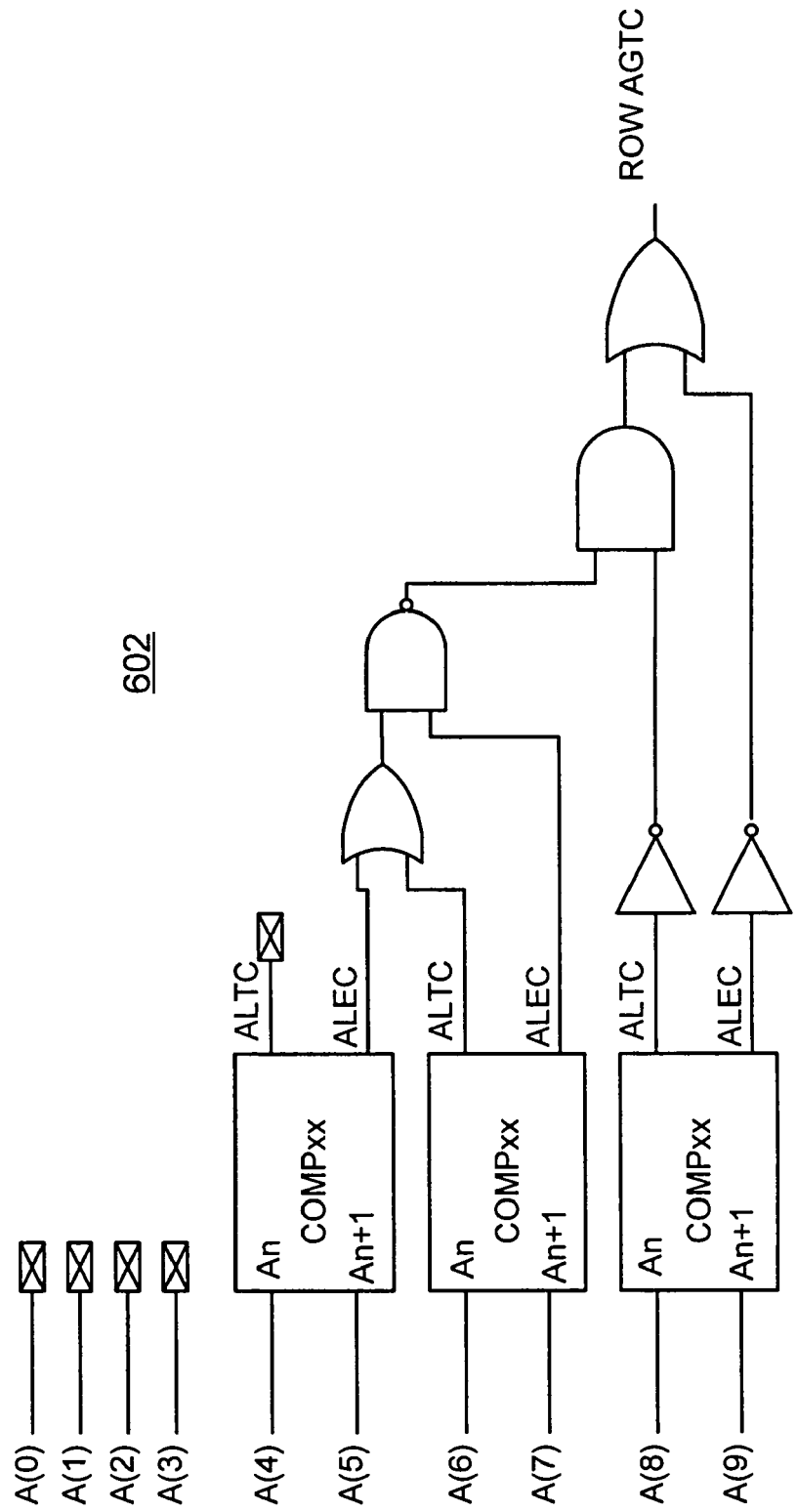
FIG. 6 is a schematic view of a compilable row compare device in accordance with the preferred embodiment of the present invention.
Figure 8:
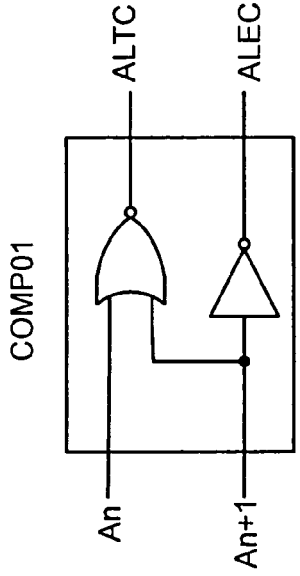
FIGS. 7–10 are schematic views of compilable logic blocks in accordance with the preferred embodiment of the present invention.
Figure 10:
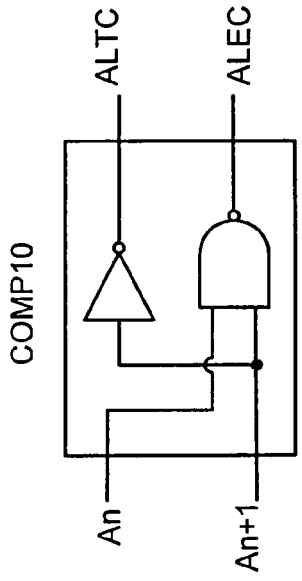
Figure 7:
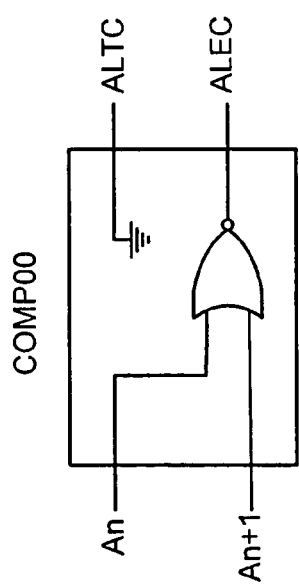
Figure 9:
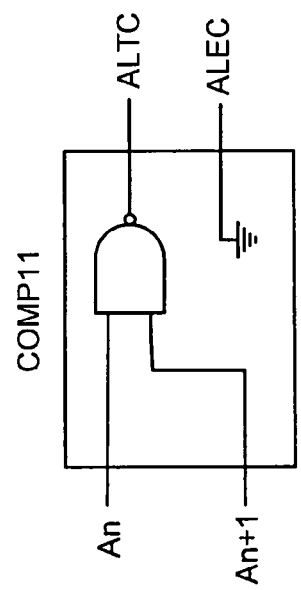

Turning now to FIG. 6, an implementation of the preferred embodiment compilable compare device 602 is illustrated schematically. While device 602 is illustrated for row address compare, it can also be applied to column address compare. Compilable compare device 602 provides increased flexibility by using a modular design in which different memory array dimensions can be handled by selectively substituting compilable logic blocks. Specifically, compilable compare device 602 can be compiled for different applications by selectively substituting compilable logic blocks COMP00, COMP01, COMP10, and COMP11, as illustrated in FIGS. 7–10, into the compare device 602. The compiler selects which of these logic blocks to substitute based on the number of rows in the corresponding compiled memory array. Specifically, if the compiled maximum address values (Cn+1, Cn) corresponding to the inputted address values (An+1, An) are both zero, then COMP00 is used. If the corresponding compiled maximum address values (Cn+1, Cn) corresponding to the inputted address values (An+1, An) are zero and one respectively, then COMP01 is used. If the corresponding compiled maximum address values (Cn+1, Cn) corresponding to the inputted address values (An+1, An) are one and zero respectively, then COMP10 is used. Finally, if the corresponding compiled maximum address values (Cn+1, Cn) corresponding to the inputted address values (An+1, An) are both one, then COMP11 is used.

For example, if the corresponding memory array has 640 rows, the compiled maximum row address is 639. The maximum row address is thus 1001111111 when converted to binary. Each bit in the maximum row address corresponds to a C(x) value. Thus, C(9)=1, C(8)=0, C(7)=0, and C(6)–C(0)=1. Thus, the COMPXX box receiving A(5) and A(4) would be substituted by logic block COMP11, as the corresponding compiled maximum address values C(5) and C(4) both equal 1. Likewise, the COMPXX box receiving A(7) and A(6) would be substituted by logic block COMP01, as C(7)=0 and C(6)=1. Finally, the COMPXX box receiving inputs A(9) and A(8) would be substituted by logic block COMP10, as C(9)=1 and C(8)=0. With the appropriate logic blocks thus substituted, the compare device 602 will compare for maximum row addresses above 639.

It should also be noted that the compilable compare device 602 is illustrated for the application where row compilations are limited to adding 16 rows per compile increment. As was described above, when an array is limited to a minium granularity of 16 rows, the 4 least significant bits of the row address are irrelevant for out-of-range address detection, since any combination of these 4 address bits will exist in both in-range and out-of-range row address values. As such, inputs A(0)–A(3) are ignored in compare device 602. However, the compare device 602 can be easily modified for other applications. For example, it can be expanded to applications of 4 rows per compile increment by adding an additional COMPXX box to inputs A(2) and A(3) and expanding the additional logic accordingly. Thus, the compare device can be easily expanded to adapt to a wide range of memory array compile designs.

Figure 11:
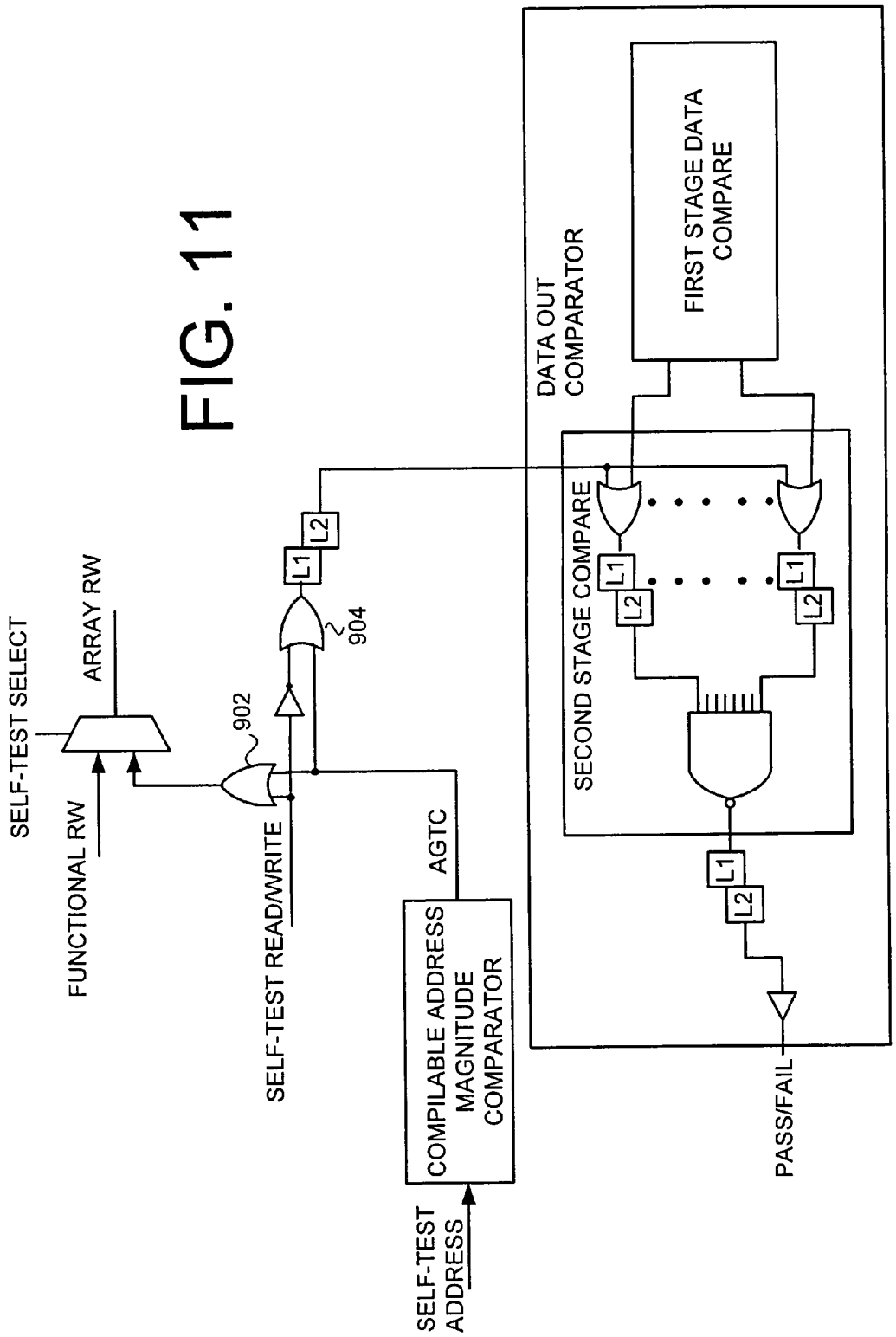

Turning now to FIGS. 11–12, circuit diagrams illustrate methods for using the preferred compilable address magnitude comparator in combination with different types of memory arrays and BIST controllers. Specifically, FIG. 11 illustrates how a compilable address magnitude comparator can be used to work with a 1-port memory array and FIG. 12 illustrates how a compilable address magnitude comparator can be used to work with a 2-port memory array. Both implementations use the same general design, that is, when an out-of-range self-test address is detected the "write" to that address is prevented, and a fail signal is also prevented from being generated.

In 1-port memory arrays, the single self-test read/write signal is used to control the operation of the memory. Turning to FIG. 11, for the 1-port array design, the self-test read/write signal is passed through an OR gate 902 that also receives the AGTC signal from the compilable address magnitude comparator. The self-test read/write signal is provided by the BIST controller and used to direct the memory array to perform a self-test read operation when "high" and to perform a self-test "write" operation when low. The output of the OR gate 902 is high whenever the self-test read/write signal is high and/or the AGTC is high. When the output of the OR gate 902 is high a self-test read operation is performed. Thus, when an out-of-range address is detected by the compilable address magnitude comparator, a high AGTC signal is provided to the OR gate, which thus forces a read to occur instead of a write. Stated another way, a fail can only be generated when 'bad' data is read from a valid address.

Additionally, the AGTC is passed to OR gate 904 along with an inverted self-test read write/signal. The output of OR gate 904 is coupled to the second stage of the memory array data out comparator. In this case a high AGTC signal prevents a fail signal from being generated by the second stage compare by forcing each input to the compare high.

This over-rides the first stage data compare and thus results in a "pass" being outputted regardless of what data is read from the memory array.

Thus, the high AGTC signal is used to prevent a write from occurring for out-of-range addresses and also prevents a fail signal from being generated for these addresses.

In 2-port memory arrays, the separate self-test read and self-test write signals are used to control the operation of the memory. Turning now to FIG. 12, for the 2-port memory array design, the self-test write signal is passed through an AND gate 912 that also receives an inverted AGTC signal from the compilable address magnitude comparator. The self-test write signal is provided by the BIST controller and is used to direct the memory array to perform a self-test write operation when at a "high" level. The output of the AND gate 912 cannot go high when the AGTC signal is high, and a write cannot occur unless the AND gate 912 output is high. Thus, a write is prevented unless the AGTC is low. Thus, when an out-of-range address is detected by the compilable address magnitude comparator, a high AGTC signal is provided, and a write is prevented.

Additionally, the AGTC is passed to OR gate 914 along with an inverted self-test read signal. The self-test read signal is provided by the BIST controller and is used to direct the memory array to perform a self-test read operation when at a "high" level. The output of OR gate 914 is coupled to the second stage of the memory array data out comparator used in self-testing. In this case a high AGTC signal prevents a fail signal from being generated by the second stage compare by forcing each input to the compare high. This over-rides the first stage data compare and thus results in a "pass" being outputted.

Thus, the high AGTC signal is used to prevent a write from occurring for out-of-range addresses and also prevents a fail signal from being generated for these addresses.

The preferred embodiment of the present invention can be applied to a wide variety of memory systems, including both 1 and 2 port memory arrays.

The present invention thus provides a method and apparatus that improves BIST flexibility without requiring the complexity of a compilable BIST circuit. Additionally, the present invention provides the ability to use a single BIST to test multiple memory arrays of different sizes.

While the invention has been particularly shown and described with reference to a preferred exemplary embodiment thereof, it will be understood by those skilled in the art that various changes in form and details may be made therein without departing from the spirit and scope of the invention. It will be also understood that, while various of the conductors are shown in the drawing as single lines, they are not so shown in a limiting sense, and may comprise plural conductors, as is understood in the art. It will also be understood that the spirit of the invention is applicable to other semiconductor technologies (e.g., BiCMOS, bipolar, silicon on insulator (SOI), silicon germanium (SiGe).

The invention claimed is:

1. A plurality of memory arrays, each memory array comprising:
  a compilable address magnitude comparator, the compilable address magnitude comparator of each memory array receiving a self-test address from a self-test controller and comparing the self-test address to a compiled maximum address of each memory array, the compilable address magnitude comparator of each memory array preventing testing of memory of each memory array corresponding to the self-test address if the self-test address exceeds the compiled maximum address of each memory array;
  wherein the compilable address magnitude comparator of each memory array prevents testing of memory of each memory array by forcing a memory pass signal;
  wherein the compilable address magnitude comparator of each memory array includes a row comparator and a column comparator, the row comparator comparing a self-test row address of each memory array and the column comparator comparing a self-test column address of each memory array; and
  wherein the compiled maximum address of each memory array comprises a maximum row address of each memory array and a maximum column address of each memory array;
  wherein the compilable address magnitude comparator of each memory array prevents testing of memory of each memory array by forcing a read operation instead of a write operation.

2. A plurality of memory arrays, each memory array comprising a compilable address magnitude comparator, the compilable address magnitude comparator of a memory array of the plurality of memory arrays comprising:
  a row comparator, the row comparator comparing a row portion of a self-test address from a self-test controller with a compiled maximum row address, the compiled maximum row address corresponding to a maximum valid row address of the memory array; and
  a column comparator, the column comparator comparing a column portion of the self-test address with a compiled maximum column address of the memory array, the compiled maximum column address corresponding to a maximum valid column address of the memory array;
  wherein the compilable address magnitude comparator modifies a self-test operation of the memory array when either the row portion of the self-test address exceeds the corresponding maximum valid row address of the memory array or the column portion of the self-test address exceeds the corresponding maximum valid column address of the memory array;
  wherein the compilable address magnitude comparator prevents testing of memory of the memory array by forcing a memory pass signal in a corresponding built-in-self-test controller;
  wherein the compilable address magnitude comparator prevents testing of memory of the memory array by forcing a read operation instead of a write operation; and
  wherein the row comparator includes at least one logic block selected from a plurality of logic blocks, with each of the plurality of logic blocks corresponding to a portion of a compiled maximum address of the memory array such that by selecting one of the plurality of logic blocks, the compilable magnitude comparator tests for the compiled maximum address of the memory array.

3. An application specific integrated circuit, the application specific integrated circuit comprising:
  a plurality of memory arrays, each memory array comprising a compilable address magnitude comparator;
  a built-in-self-test controller coupled to each memory array, the built-in-self-test controller testing the memory of each memory array;
  wherein the compilable address magnitude comparator in each memory array receiving a self-test address from the built-in-self-test controller and comparing the received self-test address with a compiled maximum address of each memory array;

wherein the compiled maximum address of each memory array corresponds to the highest valid address for each memory array;

wherein the compilable address magnitude comparator of each memory array prevents the built-in-self-test controller from testing a memory location of each memory array corresponding to the self-test address if the self-test address exceeds the compiled maximum address of each memory array;

wherein the compilable address magnitude comparator of each memory array prevents testing of memory of each memory array by forcing a read operation instead of a write operation; and wherein the compilable address magnitude comparator of each memory array prevents testing of memory of each memory array by further forcing a memory pass signal, and wherein a second memory array of the plurality of memory arrays has a different maximum number of columns than does a first memory array of the plurality of memory arrays.

4. The application specific integrated circuit of claim 3, wherein the compilable address magnitude comparator of each memory array includes a row comparator and a column comparator;

wherein the row comparator of each memory array compares a self-test row address and the column comparator of each memory array compares a self-test column address.

5. The application specific integrated circuit of claim 3, wherein the compiled maximum address of each memory array comprises a maximum row address of each memory array and a maximum column address of each memory array.

6. The application specific integrated circuit of claim 3, wherein the comparator of each memory array is compilable by selectively substituting a plurality of compilable logic blocks according to the compiled maximum address of each memory array.

* * * * *